(12) United States Patent
Vasudevan Pillai et al.

(10) Patent No.: US 6,775,323 B1
(45) Date of Patent: Aug. 10, 2004

(54) DATA CODING SYSTEM

(75) Inventors: Kumar Vasudevan Pillai, Singapore (SG); Nuntha Kumar Krishnasamy Maniam, Singapore (SG)

(73) Assignee: National University of Singapore, Crescent (SG)

( * ) Notice: Subject to any disclaimer, the term of this patent is extended or adjusted under 35 U.S.C. 154(b) by 0 days.

(21) Appl. No.: 09/513,295

(22) Filed: Feb. 25, 2000

(51) Int. Cl.[7] .............................. H03K 7/08; H03K 7/04; G08C 19/00
(52) U.S. Cl. ................. 375/238; 375/239; 375/259; 340/825.63
(58) Field of Search .................... 375/211, 219, 375/237, 238, 239, 259, 359; 340/10.1, 10.4, 10.42, 825.57, 825.63; 370/205

(56) References Cited

U.S. PATENT DOCUMENTS

| | | | |
|---|---|---|---|
| 4,517,563 A | * | 5/1985 | Diamant ................... 340/10.42 |
| 5,289,183 A | | 2/1994 | Hassett et al. |
| 5,305,008 A | | 4/1994 | Turner et al. |
| 5,442,680 A | | 8/1995 | Schellinger et al. |
| 5,533,099 A | | 7/1996 | Byrne |
| 5,568,516 A | * | 10/1996 | Strohallen et al. .......... 375/259 |
| 5,794,141 A | | 8/1998 | Zicker |
| 5,930,303 A | | 7/1999 | Walker |
| 6,088,008 A | * | 7/2000 | Reeder ......................... 345/33 |
| 6,138,010 A | | 10/2000 | Rabe et al. |
| 6,253,088 B1 | | 6/2001 | Wenk et al. |
| 6,259,932 B1 | | 7/2001 | Constien |
| 6,484,205 B1 | | 11/2002 | Byford |
| 6,493,550 B1 | | 12/2002 | Raith |

OTHER PUBLICATIONS

Hambley, "An Introduction to Communication Systems", W.H. Freeman and Company, 1990, pp. 239–240.*

* cited by examiner

*Primary Examiner*—Chieh M. Fan
(74) *Attorney, Agent, or Firm*—Senniger, Powers, Leavitt & Roedel

(57) ABSTRACT

A data coding system for coding data represented by a number of symbols is described. The system includes representing each symbol with a unique digital waveform. All the unique digital waveforms have a duty cycle greater than 50% or a duty cycle less than 50%.

8 Claims, 4 Drawing Sheets

DIGITAL 1 OR SYMBOL 1

DIGITAL 0 OR SYMBOL 2

DIGITAL 1
1 BIT DURATION

DIGITAL 0
1 BIT DURATION

DIGITAL 1 OR SYMBOL 1

DIGITAL 0 OR SYMBOL 3

DIGITAL 1

DIGITAL 0

DATA CODING SYSTEM

FIELD OF THE INVENTION

The invention relates to a data coding system and especially, a data coding system for use in a passive transponder system.

BACKGROUND OF THE INVENTION

A typical radio frequency (RF) transponder system consists of an interrogator or reader and one or several radio frequency transponders or tags. Such systems are used for remotely locating, identifying and tracking objects. Depending on the type of requirement, these transponder systems are used to read data stored in the tag or write data to the tag and in some cases to both read data from and write data to the tag.

Transponder systems are broadly classified into two categories: (i) active transponder systems; and (ii) passive transponder systems. Active transponder systems include a battery in the tag and the battery provides DC power for the tag either wholly or partly. Passive transponder systems do not have a battery in the tag. In passive transponder systems, DC power requirement for the tag is obtained from the electromagnetic waves emitted by the interrogator. The interrogator sends, depending on the type of system, either continuous or pulsed RF electromagnetic waves. These electromagnetic waves are received by an antenna in the tag and rectified to generate the DC power for the tag. The efficiency of this power transformation is low and is restricted by the performance of the rectifying device as well as other components in the tag. It is also restricted by a decrease in the received signal level as the tag moves away from the interrogator. Therefore, the operating distance or the range of the passive transponder system is dependent on the distance at which the RF signal received by the tag is high enough to generate sufficient DC power to operate the tag.

In operation, when the RF signal strength is high enough to operate the tag, a logic circuit or microcontroller within the tag receives the enquiry from the interrogator and generates a serial data signal representing the data that the tag is to send in response to the interrogator. This serial data signal is transmitted back to the interrogator via the tag antenna using the same RF signal emitted by the interrogator by backscatter or by coupling. The serial data signal is used by the tag to create a change in the loading of the antenna or resonance of the antenna or the impedance seen by the antenna in the tag according to the state of the data signal, in order to produce the backscatter. The interrogator antenna receives the backscattered response signal and the response signal is demodulated in the interrogator to recover the data sent by the tag.

During the period when the tag sends the response data signal, two simultaneous activities take place in the tag:

1. The response data signal is sent by backscattering; and
2. The DC power requirement of the tag is generated from the RF signal emitted by the interrogator.

As these two activities are taking place simultaneously, the DC power transformation from the RF signal gets affected. The tag will be able to derive optimum DC power only when the antenna is optimally loaded or when it is resonant or when its impedance is matched since the tag receives optimum electromagnetic waves only under this condition. Thus when the loading of the antenna or its resonance or the impedance seen by the antenna is changed in accordance with the data signal in order to produce backscatter, the tag will receive optimum electromagnetic waves only for the state of the data signal which produces optimum loading of the antenna or resonance of the antenna or when the antenna impedance is matched. During the other state of the data signal, the tag will not receive optimum electromagnetic waves. Thus the RF power received by the tag depends on the duration of the state of the response signal which results in optimum electromagnetic waves received by the tag and this in turn determines the RF to DC power transformation in the tag. During the period of the data signal when the tag does not receive optimum electromagnetic waves, the passive tag relies on charge stored in a reserve capacitor of the rectifier circuit to supply its necessary DC power requirement.

In prior art systems coding schemes like Manchester code and Miller code are used to represent the response data signal. In Manchester coded binary data, the bit whether it is a '1' or a '0' has a duty cycle of 50%. This means that both states have equal duration. Therefore, the response data signal will have a high state and a low state for almost equal duration. The Manchester coded waveform of a digital 1 and 0 are shown in FIGS. 4a and 4b, respectively. From FIGS. 4a and 4b it can be seen that for a duration of one bit, 50% of the duration consists of State1 (or the high state) and the remaining 50% consists of State2 (or the low state). This is a limitation and because of this the RF to DC power transformation is not efficient, as the power transformation is higher only for one of the states of the symbols, and so for only approximately 50% of the signal. When the data sequence has bits digital 1 and 0 coming together as 10 or 01, as shown in FIG. 5, the state of the waveform remains high or low as the case may be for a full one bit duration. In this case the RF to DC power transformation is not efficient for the full duration of the bit period. Other data coding schemes are similar as far as the duration of the two states is concerned.

U.S. Pat. No. 5,305,008 describes the use of an optimally configured rf voltage magnifying resonator circuit placed between the antenna and the DC rectifier circuit to enhance the effective interrogation range. The same patent also describes another method by which the interrogation range is further enhanced. This is by appropriate shaping of the envelope of the interrogating signal generated by the interrogator.

U.S. Pat. No. 5,930,303 describes an encoding method called aperture coding. In this method a data bit having a bit center is divided into plurality of time segments or apertures. The encoding is done by selecting a first subset from the plurality of apertures ending prior to the bit center and the second subset from the remaining plurality of apertures ending after the said bit center. This form of encoding has a bit center and apertures ending prior to the bit center is decoded as a digital 1 and apertures ending after the bit centre is decoded as a digital 0. This form of encoding is used to improve the spectral efficiency. However, the data sequence using this method of encoding will also have a fairly long duration of each of the states compared to the total duration of the data sequence.

SUMMARY OF THE INVENTION

In accordance with a first aspect of the present invention, there is provided a data coding system for coding data represented by a number of symbols, the system comprising representing each symbol with a unique digital waveform, all the unique digital waveforms having a duty cycle greater than 50% or a duty cycle less than 50%.

An advantage of the invention is that by providing a coding system in which each symbol is represented by a unique digital waveform and all the unique digital waveforms have a duty cycle greater than 50% or less than 50% it is possible to maximise the power transformation efficiency of a tag in a passive transponder system.

The term "duty cycle" as used herein is the ratio of the duration of a digital waveform "ON" (or high state) time to the total period of the waveform.

Preferably, the unique digital waveforms differ from each other by changes in state at different points during the period of the waveform.

Typically, each unique digital waveform may have a unique duty cycle.

Preferably, the data is represented by binary symbols. However, that other symbols could be used to represent the data.

Typically, where the duty cycles are greater than 50%, one waveform has a duty cycle of 100%. Typically, where the duty cycles are less than 50%, one waveform has a duty cycle of 0%.

In accordance with a second aspect of the invention, there is provided a passive transponder system comprising a central unit and a radio frequency transponder, the radio frequency transponder, in response to a radio frequency interrogation signal from the central unit, coding data to be transmitted to the central unit using a coding system in accordance with the first aspect of the invention.

Preferably, the duty cycles of the digital waveforms are greater than 50% if the high state of the waveform provides better RF to DC power conversion than the low state, and typically, the duty cycles are maximised. Preferably, the duty cycles of the waveforms are less than 50% if the low state of the waveform provides better RF to DC power conversion, and typically the duty cycles are minimised.

The difference between the duty cycles is kept as small as possible to ensure that the bit duration of both digital 1 and digital 0 will be dominated by one state whether it is a high state or a low state. But at the same time the difference should be sufficient enough to ensure proper decoding of the data at the interrogator. A high duty cycle will ensure that the state of the bit will remain high for most of the bit duration whether it is representing a digital 1 or a digital 0. On the other hand a low duty cycle will ensure that the state of the bit will remain low for most of the bit duration whether it is representing a digital 1 or a digital 0. For encoding, the decision of whether to go for the high duty cycle or the low duty cycle will depend on which state of the bit produces optimum loading of the tag antenna or resonance of the tag antenna or optimum matching to the tag antenna impedance. This ensures that the tag receives optimum RF waves for most of the bit duration and the duration of the bit period during which the RF waves received by the tag is not the optimum remains very small. This method of encoding improves the efficiency of the RF to DC power transformation when the passive transponder is sending its response signal.

BRIEF DESCRIPTION OF THE DRAWINGS

Examples of a data coding system in accordance with the invention will now be described with reference to the accompanying drawings, in which.

PREFERRED EMBODIMENTS OF THE INVENTION

Figure 1:
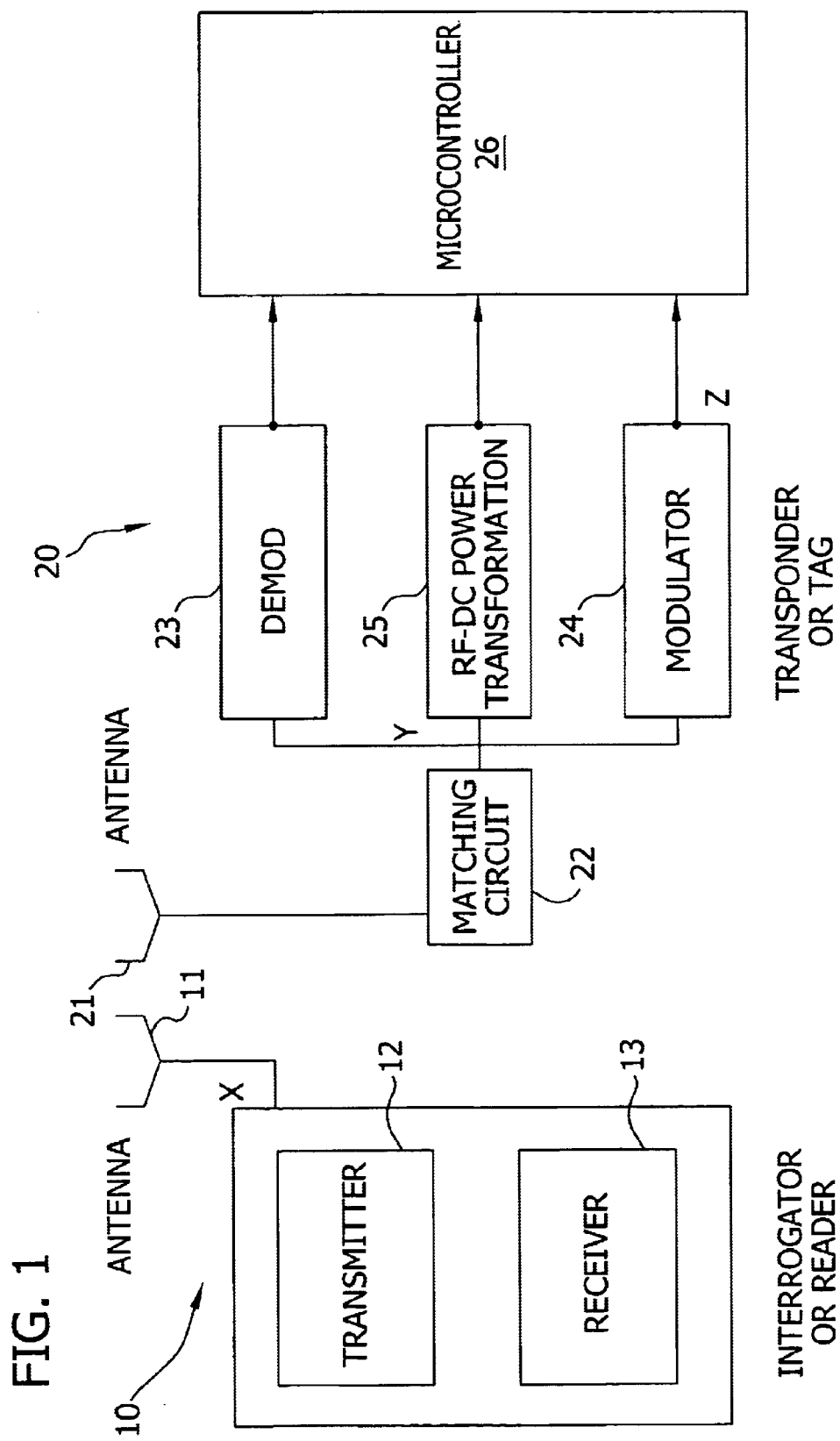
FIG. 1 is a block diagram of a passive transponder system showing an interrogator and a tag.

FIG. 1 shows a passive transponder system with typical sub blocks. The system comprises an interrogator (or reader) 10 and a transponder (or tag) 20. The interrogator 10 comprises an antenna 11 and a transmitter 12 and receiver 13, both of which are coupled to the antenna 11. The transponder 20 comprises an antenna 21 which is coupled to a matching circuit 22. The matching circuit 22 is coupled to a demodulator 23, a modulator 24 and a RF to DC power transformation circuit 25. The demodulator 23, the modulator 24 and the transformation circuit 25 are each coupled to a microcontroller 26. The antennas 11, 21, the transmitter 12, the receiver 13, the matching circuit 22, the demodulator 23, the modulator 24, the transformation circuit 25 and the microcontroller 26 may all be conventional standard components used in conventional passive transponder circuits.

Figure 8:
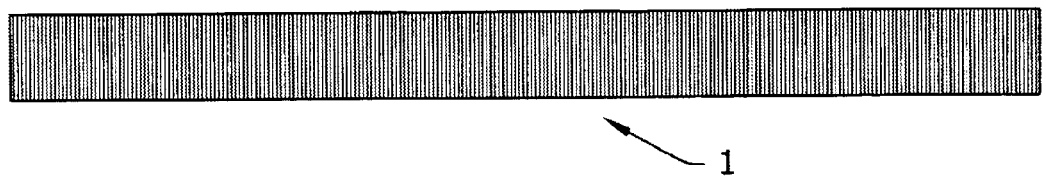
FIG. 8 shows the RF waves emitted from the interrogator antenna.

In use, the interrogator antenna 11 emits a continuous RF signal waveform 1 (as shown in FIG. 8), which is received by the tag antenna 21. The tag antenna 21 receives the RF signal 1 and the RF to DC power transformation circuit 25 converts the RF signal 1 to DC power. When the microcontroller 26 is powered up by the DC power converted from the RF signal 1, the microcontroller 26 generates digital serial data, which may correspond to identity data or some other form of information stored in the microcontroller. This serial data is output from the microcontroller 26 to the modulator 24 which may be in the form of a switch. The modulator 24 changes its state in accordance with the serial data received from the microcontroller. However, when the modulator 24 changes state, the impedance of the matching circuit 22 also changes which in turn affects the RF signal received by the transformation circuit 25. This is because the antenna 21 is (and can only be) optimally matched for one state of the modulator 24, which is in turn dependent on the state of the data signal received from the microcontroller 26.

Figure 5:
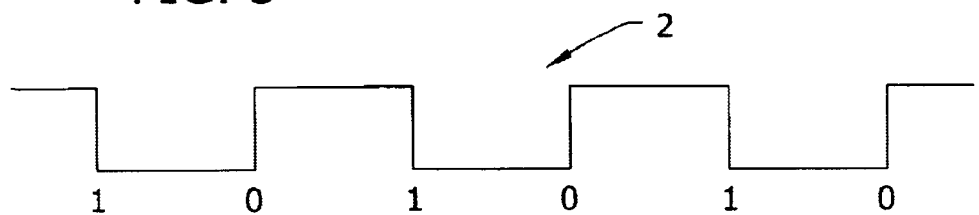
FIG. 5 shows a data sequence encoded using the Manchester coding shown in FIGS. 4a and 4b.
Figure 9:
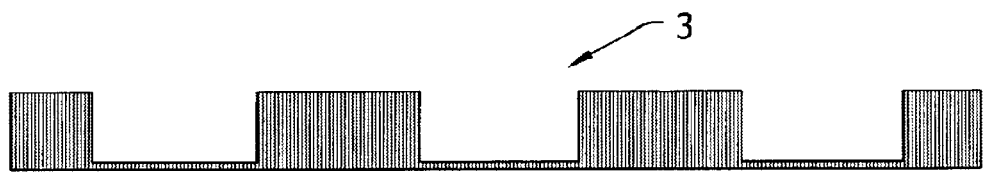
FIG. 9 shows the pattern of RF waves available for deriving the DC power in the tag when the tag sends the Manchester coded data shown in FIG. 5.

Therefore, when the serial data from the microcontroller is coded using the Manchester coding scheme and, for example the serial data consists of the 6-bit signal "101010", as shown by waveform 2 in FIG. 5, the RF signal received by the transformation circuit 25 is shown by the waveform 3 in FIG. 9. From FIG. 9 it can be seen that the duration for which the amplitude of the received RF signal 3 remains high is only about 50% of the total duration of the RF signal 3. Hence, with the Manchester coding scheme, RF to DC power transformation efficiency is optimum only for about 50% of the data period. This compromises the maximum separation between the antennas 11, 21 at which the passive transponder system will operate.

Figure 2A:
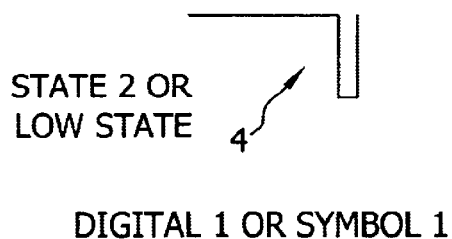
FIG. 2a shows the encoded waveform of a first symbol in accordance with the invention when state1 (or the high state) provides better RF to DC power transformation.
Figure 2B:
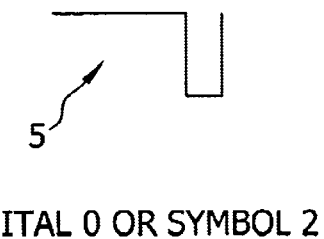
FIG. 2b shows the encoded waveform of a second symbol in accordance with the invention when state1 provides better RF to DC power transformation.
Figure 3:
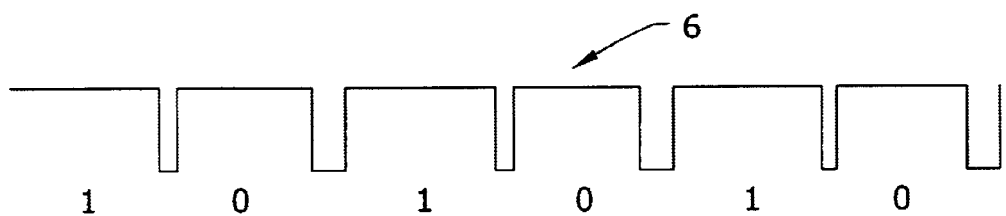
FIG. 3 shows a data sequence encoded using waveforms shown in FIGS. 2a and 2b.
Figure 4A:
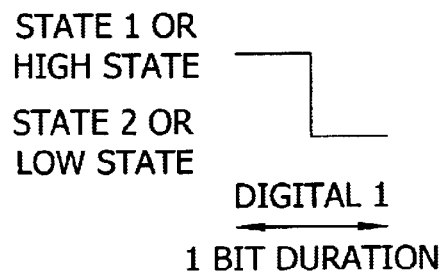
FIGS. 4a and 4b show the encoded waveforms for a digital 1 and a digital 0 respectively encoded using the prior art Manchester coding.
Figure 4B:
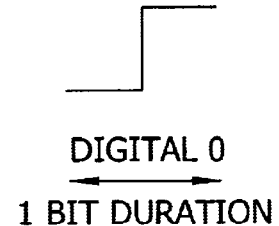
Figure 10:
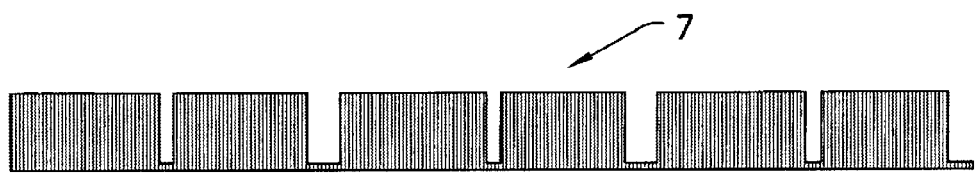
FIG. 10 shows the pattern of RF waves available for deriving the DC power in the tag when the tag sends the coded data shown in FIG. 3.

However, when the same digital serial data signal "101010" is coded using the waveforms 4, 5 of the invention shown in FIGS. 2a and 2b, the data signal received by the modulator 24 is the waveform 6 shown in FIG. 3. This results in the RF signal received by the transformation circuit 25 from the matching circuit 22 corresponding to the waveform 7 shown in FIG. 10. From FIG. 10 it can be seen that the duration of the waveform 7 for which the amplitude of the received RF signal remains high is substantially higher than 50% of the total duration of the waveform 7. Therefore, the RF to DC power transformation is much higher where the serial data is encoded using waveforms 4, 5 shown in FIGS. 4a and 4b. The higher the duty cycle of the waveforms 4, 5, the better will be the RF to DC power transformation.

Figure 6A:
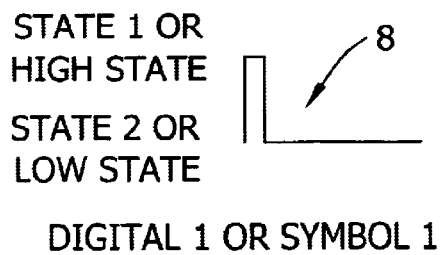
FIGS. 6a and 6b show the encoded waveform of a first and a second symbol respectively in accordance with the invention when state 2 (or the low state) provides better RF to DC power transformation.
Figure 6B:
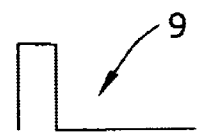
Figure 7:
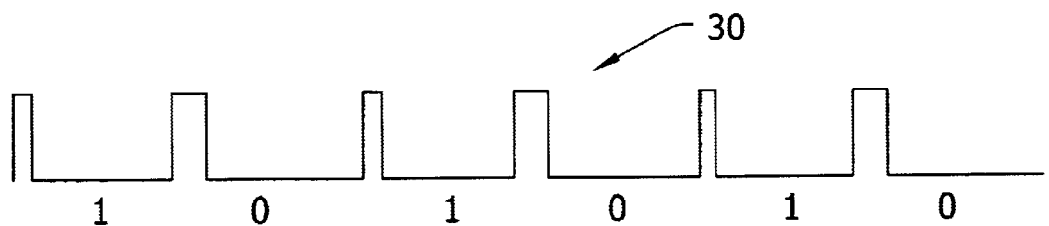
FIG. 7 shows a data sequence encoded using the waveforms shown in FIGS. 6a and 6b.
Figure 11:
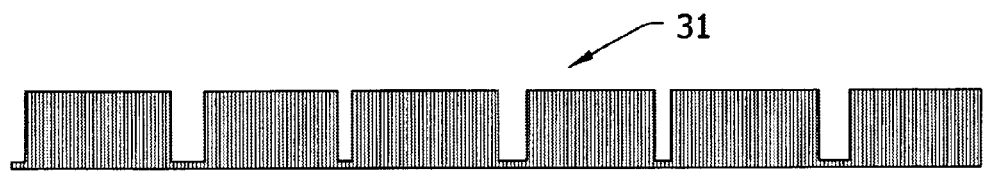
FIG. 11 shows the pattern of RF waves available for deriving the DC power in the tag when the tag sends the encoded data shown in FIG. 7.

The serial data signal is encoded using waveforms 4, 5 where the efficiency of the RF to DC power transformation is greater for a high duty cycle. If the efficiency of the power transformation is greater for a low duty cycle, the serial data may be encoded in accordance with the invention using waveforms 8, 9 shown in FIGS. 6a and 6b which are for a digital "1" and "0" respectively. Using the waveforms 8, 9 the data signal "101010" is encoded to waveform 30 shown in FIG. 7. This results in the RF signal received by the transformation circuit from the matching circuit corresponding to waveform 31 shown in FIG. 11. As for the waveform 7, the waveform has an amplitude which is high for substantially greater then 50% of the total duration of the waveform 31. Therefore, the RF to DC power transformation is much higher than for the same data signal encoded using the Manchester encoding scheme.

The block diagram of the passive transponder system shown in FIG. 1 is only one possible example and several other configurations are possible. For example, the backscattering may be produced when the modulator 24 changes the antenna 21 resonance, instead of the impedance of the matching circuit 22, in accordance with the serial data signal emitted by the microcontroller. In another example, the backscattering may be produced when the modulator 24 changes the loading of the antenna 21 in accordance with the serial data signal emitted by the microcontroller. In yet another example the backscattering may be produced when the modulator 22 changes any characteristic of any of the sub blocks or components in the transponder either independently or in combination.

Figure 12A:
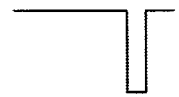
FIGS. 12a and 12b show another example of encoded waveforms for a digital "1" and a digital "0" respectively in accordance with the invention when state 1 (or the high state) provides better RF to DC power transformation.
Figure 12B:
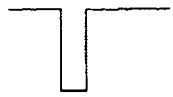

In the waveforms 4, 5, 8, 9 the length of the duty cycle is different between the symbols (in the examples described above the symbols are digital "1" and "0"). However, in the invention other types of waveform may also be used. For example, the length of the duty cycles may be the same for all symbols and the symbols be differentiated by a change in state at a different point during the waveform. A possible example of such waveforms is waveforms 35, 36 shown in FIGS. 12a and 12b which represent digital "1" and "0" respectively.

We claim:

1. A passive transponder system comprising a central unit and a radio frequency transponder, the radio frequency transponder comprising:
   an RF-to-DC power converter unit arranged, in response to a radio frequency interrogation signal from the central unit, to obtain DC power from the RF interrogation signal; and
   a modulating unit arranged, in response to the RF interrogation signal from the central unit, to code data to be transmitted to the central unit and represented by a number of symbols, using a coding system, the coding system comprising representing each symbol with a unique digital waveform obtained by switching between a high state and a low state,
   the RF-to-DC power converter unit generating higher DC power when the modulating unit is in the high state than the low state, and all the unique digital waveforms having a duty cycle greater than 50%.

2. A passive transponder system comprising a central unit and a radio frequency transponder, the radio frequency transponder comprising:
   an RF-to-DC power converter unit arranged, in response to a radio frequency interrogation signal from the central unit, to obtain DC power from the RF interrogation signal; and
   a modulating unit arranged, in response to the RF interrogation signal from the central unit, to code data to be transmitted to the central unit and represented by a number of symbols, using a coding system, the coding system comprising representing each symbol with a unique digital waveform obtained by switching between a high state and a low state,
   the RF-to-DC power converter unit generating higher DC power when the modulating unit is in the low state than the high state, and all the unique digital waveforms having a duty cycle less than 50%.

3. A passive transponder system according to claim 1, wherein the unique digital waveforms differ from each other by changes in states at different points during the period of the waveform.

4. A passive transponder system according to claim 1, wherein each unique digital waveform has a unique duty cycle.

5. A passive transponder system according to claim 1, wherein one waveform has a duty cycle of 100%.

6. A passive transponder system according to claim 2, wherein the unique digital waveforms differ from each other by changes in states at different points during the period of the waveform.

7. A passive transponder system according to claim 2, wherein each unique digital waveform has a unique duty cycle.

8. A passive transponder system according to claim 2, wherein one waveform has a duty cycle of 0%.

* * * * *

UNITED STATES PATENT AND TRADEMARK OFFICE
CERTIFICATE OF CORRECTION

PATENT NO.    : 6,775,323 B1
DATED         : August 10, 2004
INVENTOR(S)   : Kumar Vasudevan Pillai et al.

It is certified that error appears in the above-identified patent and that said Letters Patent is hereby corrected as shown below:

Title page,
Item [73], Assignee, "National University of Singapore, Crescent (SG)" should read
-- National University of Singapore, Singapore (SG) --

Signed and Sealed this

Second Day of August, 2005

JON W. DUDAS
*Director of the United States Patent and Trademark Office*